US008247795B2

(12) United States Patent
Jun et al.

(10) Patent No.: US 8,247,795 B2
(45) Date of Patent: Aug. 21, 2012

(54) INTERFUSED NANOCRYSTALS AND METHOD OF PREPARING THE SAME

(75) Inventors: Shin Ae Jun, Seongnam-si (KR); Eun Joo Jang, Daejeon-si (KR); Seong Jae Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1282 days.

(21) Appl. No.: 11/822,677

(22) Filed: Jul. 9, 2007

(65) Prior Publication Data

US 2008/0029760 A1 Feb. 7, 2008

Related U.S. Application Data (62) Division of application No. 11/269,685, filed on Nov. 9, 2005.

(30) Foreign Application Priority Data

Nov. 11, 2004 (KR) ............ 10-2004-0091894
Aug. 29, 2005 (KR) ............ 10-2005-0079284

(51) Int. Cl.
*H01L 31/00* (2006.01)
(52) U.S. Cl. ............ 257/17; 257/22; 257/42; 977/814
(58) Field of Classification Search .......... 257/17, 257/22, E29.07, 42; 977/814
See application file for complete search history.

(56) References Cited

U.S. PATENT DOCUMENTS

| 6,207,229 | B1 | 3/2001 | Bawendi et al. |
| 6,322,901 | B1 | 11/2001 | Bawendi et al. |
| 7,253,452 | B2 * | 8/2007 | Steckel et al. ............ 257/103 |
| 7,402,832 | B2 * | 7/2008 | Lee ............ 257/17 |
| 2003/0066938 | A1 * | 4/2003 | Zimmerman ............ 248/301 |
| 2004/0110002 | A1 | 6/2004 | Kim et al. |
| 2004/0151898 | A1 | 8/2004 | Reiss et al. |
| 2005/0258418 | A1 | 11/2005 | Steckel et al. |

FOREIGN PATENT DOCUMENTS

WO 2004/066361 8/2004

OTHER PUBLICATIONS

Dabbousi et al., "(CdSe)ZnS Core—Shell Quantum Dots: Synthesis and Characterization of a Size Series of Highly Luminescent Nanocrystallites", *J. Phys. Chem. B*, 1997, pp. 9463-9475, American Chemical Society.

Dabbousi B O et al : "(CdSe) ZnS core-shell quantum dots: synthesis and characterization of a size series of highly luminescent nanocrystallites", Journal of Physical Chemistry. B, Materials, vol. 101, No. 46, 1997, pp. 9463-9475.

Office Action—EP Application No. 10186278.7 received from European Patent Office issued May 19, 2011.

* cited by examiner

*Primary Examiner* — Howard Weiss
*Assistant Examiner* — Steven Rao
(74) *Attorney, Agent, or Firm* — Cantor Colburn LLP (57) ABSTRACT

Interfused nanocrystals including two or more materials, further including an alloy layer formed of the two or more materials. In addition, a method of preparing the interfused nanocrystals. In the interfused nanocrystals, the alloy layer may be present at the interface between the two or more nanocrystals, thus increasing the material stability. A material having excellent quantum efficiency in the blue light range may be synthesized.

29 Claims, 8 Drawing Sheets

INTERFUSED NANOCRYSTALS AND METHOD OF PREPARING THE SAME

CROSS-REFERENCE TO RELATED PATENT APPLICATION

This application claims the benefit of Korean Patent Application Nos. 2004-91894 and 2005-79284, filed on Nov. 11, 2004 and Aug. 29, 2005, respectively, in the Korean Intellectual Property Office, and as a divisional application of U.S. application Ser. No. 11/269,685, filed Nov. 9, 2005, the entire contents of which are hereby incorporated by references.

BACKGROUND OF THE INVENTION

1. Field of the Invention

Embodiments of the present invention relate, generally, to interfused nanocrystals and a method of preparing the same, and more particularly, to interfused nanocrystals comprising two or more materials, which further include a layer comprising an alloy of the above materials, and to a method of preparing the interfused nanocrystals.

2. Description of the Related Art

In general, nanocrystals, which are materials having nano meter sized crystals, are composed of hundreds to thousands of atoms. As such, since the small sized material has a large surface area per unit volume a large portion of the atoms is exposed on the surface of the material. Therefore, manifesting unique electrical, magnetic, optical, chemical, or mechanical properties, different from the inherent properties of the material itself, can be adjusted by controlling the physical size of the nanocrystals.

Conventionally methods of preparing nanocrystals in dry phase have been attempted using vapor deposition processes, such as MOCVD (Metal Organic Chemical Vapor Deposition) or MBE (Molecular Beam Epitaxy). Chemical wet processes to grow crystals by adding a precursor to an organic solvent in the presence of a surfactant has been rapidly developed over the latest ten years. In a chemical wet process, when the crystals are grown, the surfactant naturally surrounds the surface of the nanocrystals and thus functions as a dispersant to control the growth of the crystals. Therefore, a chemical wet process may be performed more easily and inexpensively than vapor deposition processes such as MOCVD or MBE, thus uniformly controlling the size and shape of the nanocrystals.

U.S. Pat. No. 6,322,901 discloses a semiconductor nanocrystal material having a core-shell structure and increased quantum efficiency, and U.S. Pat. No. 6,207,229 discloses a method of preparing a semiconductor nanocrystal material having a core-shell structure. The semiconductor nanocrystals having a core-shell structure are reported to have quantum efficiency increased to 30-50%. In the above-mentioned conventional techniques, the optical property of a nanocrystal emitting pure-wavelength light with high efficiency, which is induced by the electron-hole recombination only at an edge of an energy band gap, may be applied to displays or to bio image sensors.

However, the above conventional techniques are disadvantageous because the preparation of core-shell nanocrystals emitting blue light requires a core crystal having a small size (a diameter of 2 nm or less), which becomes very unstable during the shell growth reaction and thus may aggregate.

OBJECTS AND SUMMARY

Accordingly, embodiments of the present invention have been made keeping in mind the above problems occurring in the related art, and an object of embodiments of the present invention is to provide nanocrystals having a novel structure that is able to exhibit excellent quantum efficiency in the blue light range and superior material stability.

According to an aspect of embodiments of the present invention for achieving the above object, there are provided interfused nanocrystals composed of two or more materials, further including a layer comprising an alloy of the two or more materials.

According to another aspect of embodiments of the present invention, there is provided a method of preparing interfused nanocrystals, including (a) forming a first nanocrystal; (b) growing a second nanocrystal comprising a material different from that of the first nanocrystal on the surface of the first nanocrystal obtained in (a); and (c) forming an alloy layer at an interface between the first nanocrystal and the second nanocrystal through diffusion.

According to a further aspect of embodiments of the present invention, there are provided interfused nanocrystals, prepared using the above method.

According to yet another aspect of embodiments of the present invention, there is provided a diode, including the interfused nanocrystals prepared using the above method.

BRIEF DESCRIPTION OF THE DRAWINGS

The above and other objects, features and advantages of embodiments of the present invention will be more clearly understood from the following detailed description taken in conjunction with the accompanying drawings, in which.

DETAILED DESCRIPTION OF THE PREFERRED EMBODIMENTS

Hereinafter, a detailed description will be given of embodiments of the present invention, with reference to the appended drawings.

An aspect of embodiments of the present invention pertains to interfused nanocrystals comprising two or more materials, in which a layer comprising an alloy of the two or more materials is further included.

The alloy layer, which may be included in the interfused nanocrystals of embodiments of the present invention, is formed into an alloy interlayer at an interface of the materials constituting the nanocrystals. Also, the alloy layer functions to decrease a difference in a lattice constant of the materials constituting the nanocrystals, thus increasing material stability.

Figure 1:
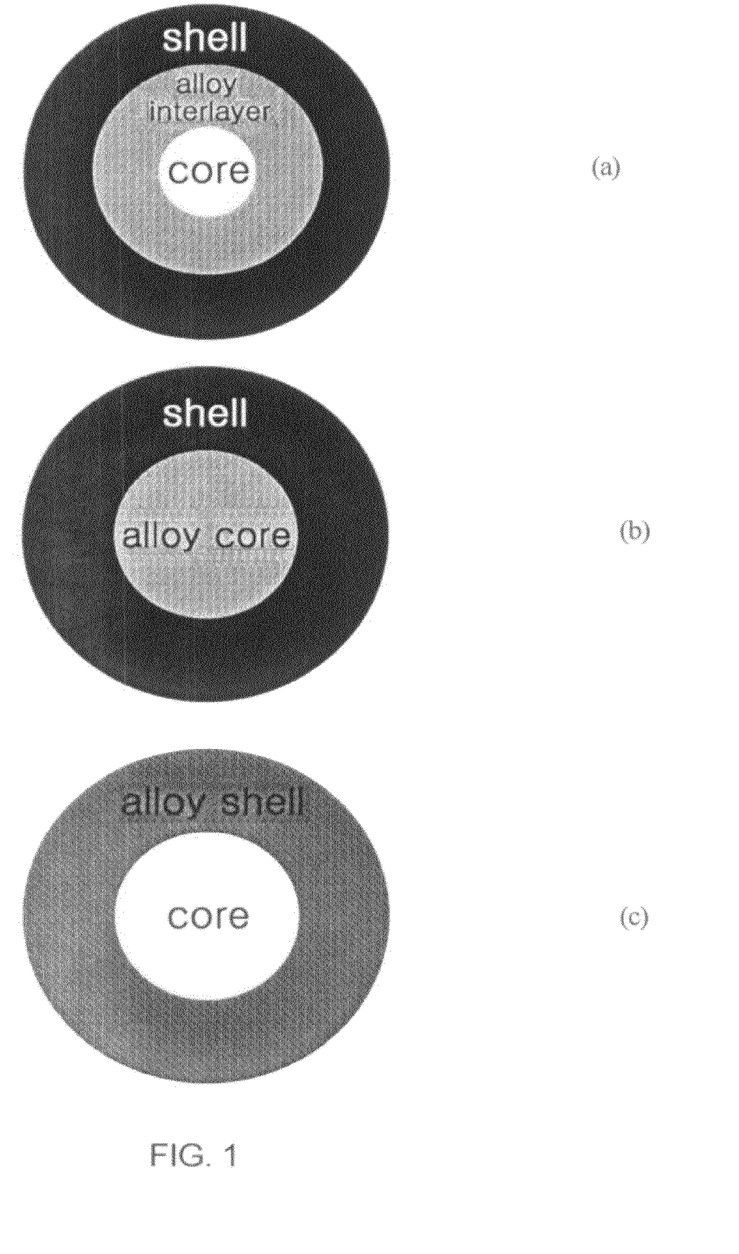
FIG. 1 is a schematic view showing a structure of spherical nanocrystals, according to embodiments of the present invention.

FIG. 1 shows a structure of interfused spherical nanocrystals, according to embodiments of the present invention. In the three-dimensional shapes of spheres, a core, an alloy interlayer, and a shell may be sequentially formed. See, for example, FIG. 1(a). In cases where the volume of the core is small or the shell is more rapidly diffused into the core, the alloy layer may be diffused up to the central portion of the core, resulting in an alloy core-shell structure. See, for example, FIG. 1(b). In addition, in cases where the shell is thin or the core is more rapidly diffused into the shell, the alloy layer may be diffused up to the outer surface of the shell, resulting in a core-alloy shell structure. See, for example, FIG. 1(c).

Figure 2:
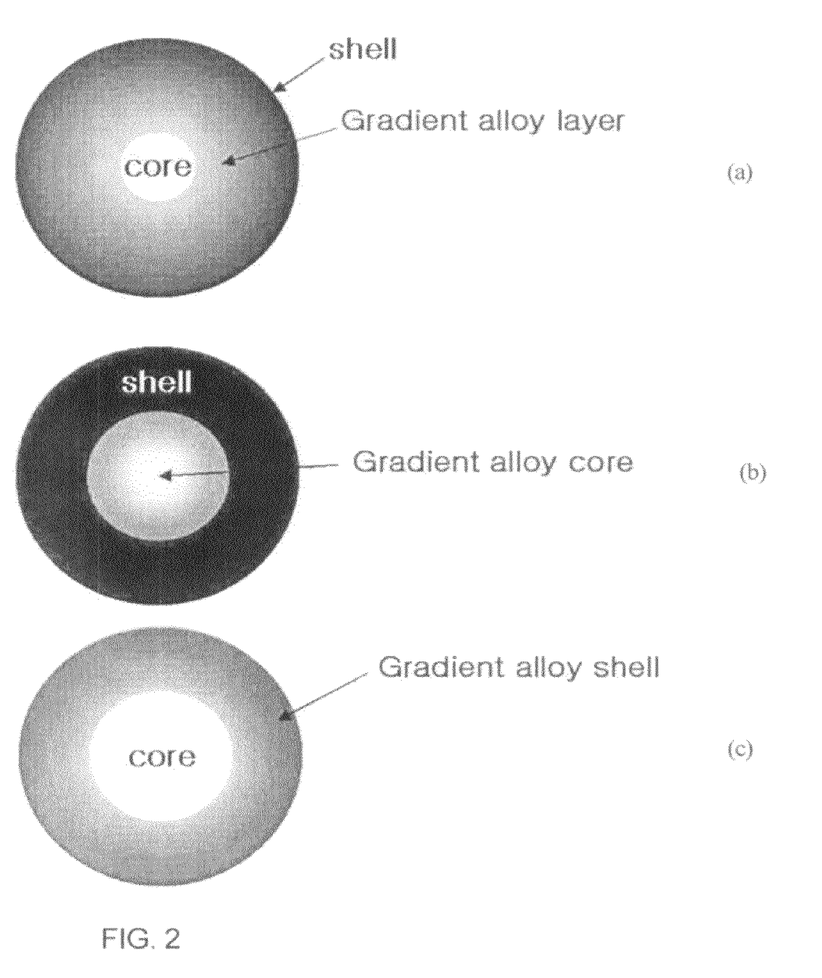
FIG. 2 is a schematic view showing a structure of spherical nanocrystals having a gradient alloy layer, according to embodiments of the present invention.

Turning now to FIG. 2, in a spherical nanocrystal structure of embodiments of the present invention, a corresponding alloy layer is shown in a gradient alloy structure, instead of a homogeneous alloy phase. See, for example, FIG. 2(a), (b), and (c).

Figure 3:
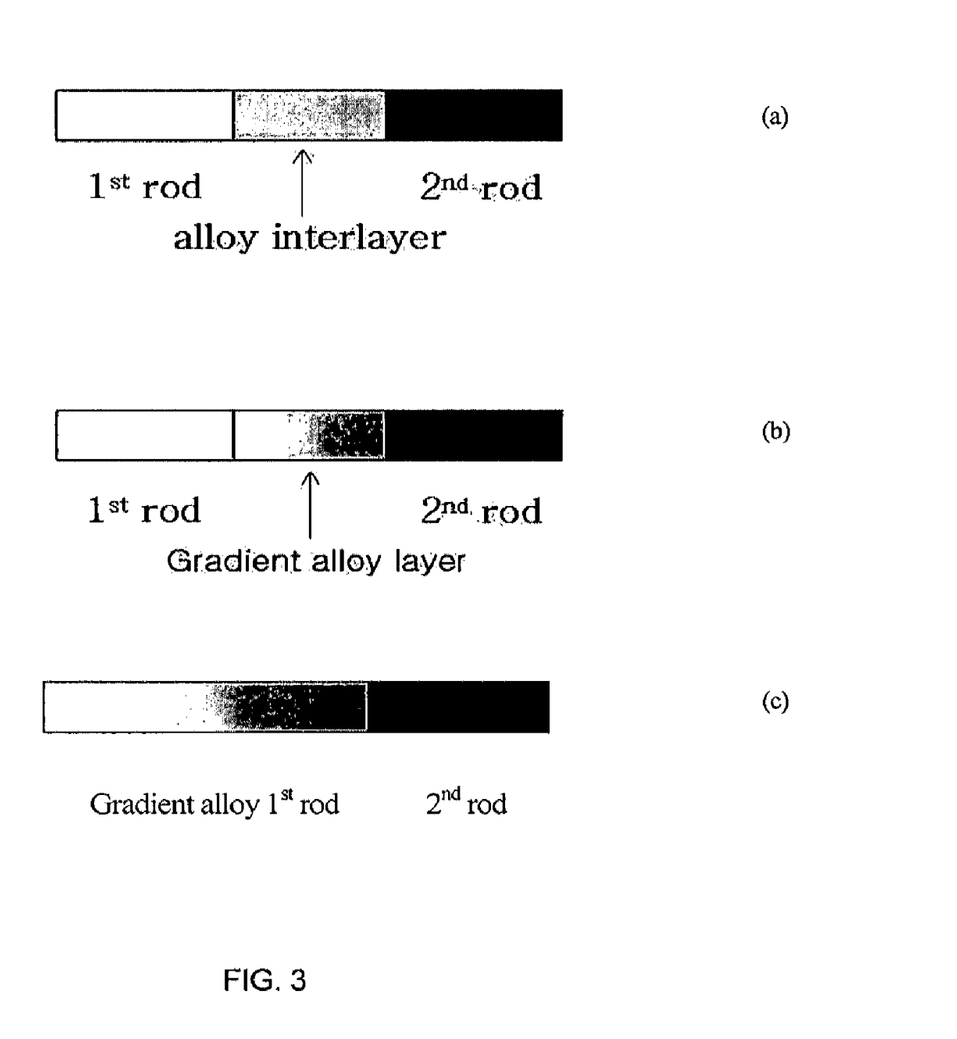
FIG. 3 is a schematic view showing a structure of rod type nanocrystals and of a gradient alloy layer, according to embodiments of the present invention.

FIG. 3 shows a structure of rod type interfused nanocrystals, according to embodiments of the present invention. In the generally two-dimensional shapes of rods, when two or more materials are longitudinally connected and grown, a first rod, an alloy interlayer, and a second rod may be sequentially formed. See, for example, FIG. 3(a). In addition, the alloy interlayer may be in the form of a gradient alloy layer, instead of a homogenous alloy phase. See, for example, FIG. 3(b). Even in the rod shape, when the two or more materials are longitudinally connected and grown, in the cases where the first rod is short or the second rod is more rapidly diffused into the first rod, the alloy layer may be diffused up to the end of the first rod, thereby forming an alloy rod-second rod structure. See, for example, FIG. 3(c).

Figure 4:
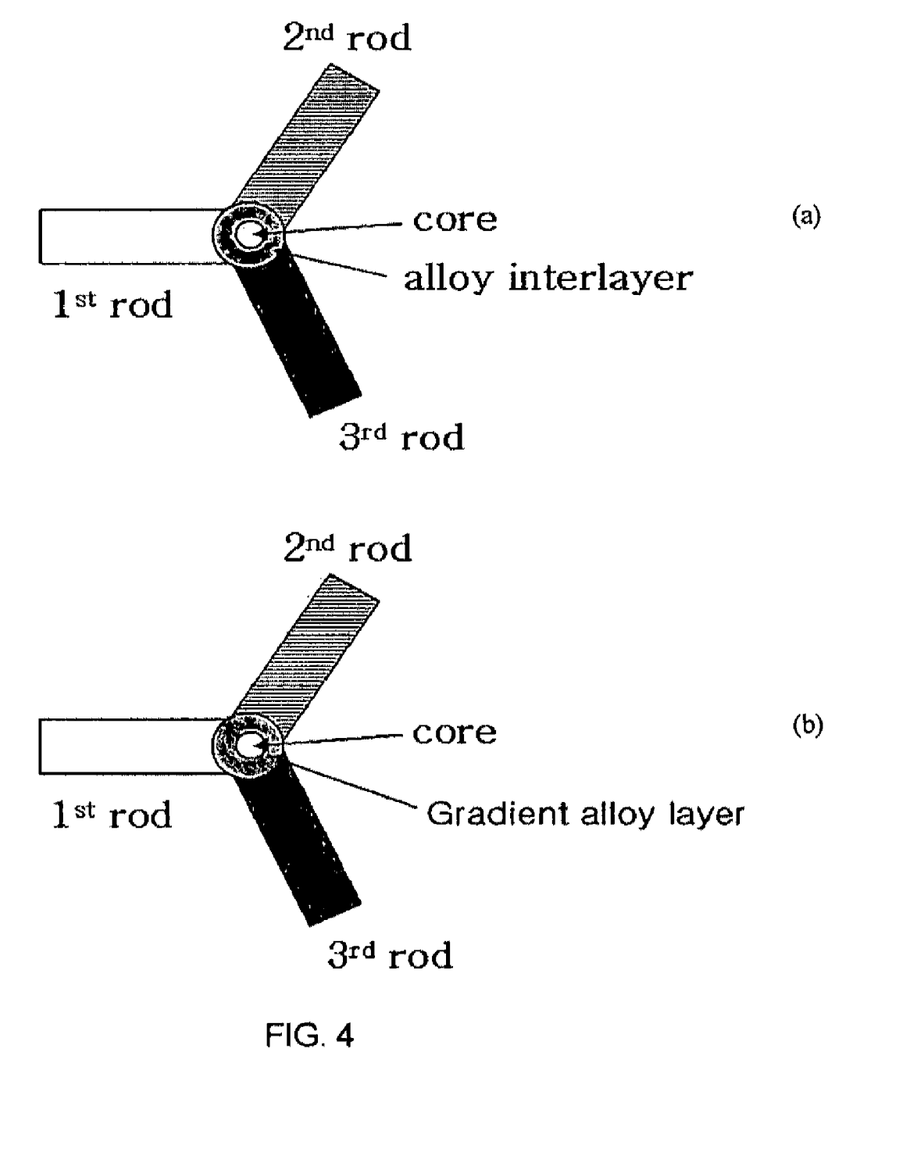
FIG. 4 is a schematic view showing a structure of tripod type nanocrystals and of a gradient alloy layer, according to embodiments of the present invention.

FIG. 4 shows a structure of tripod type interfused nanocrystals, according to embodiments of the present invention. In the tripod shape, a first rod, a second rod, and a third rod may be radially formed around a core, and an alloy interlayer may be formed at the interface of the core and the three rods. See, for example, FIG. 4(a). In addition, the alloy interlayer may be in the form of a gradient alloy layer, instead of a homogenous alloy phase. See, for example, FIG. 4(b). In addition, when two or more materials are connected in a thickness direction to grow them, a core rod, an alloy interlayer, and a shell rod may be formed.

Figure 5:
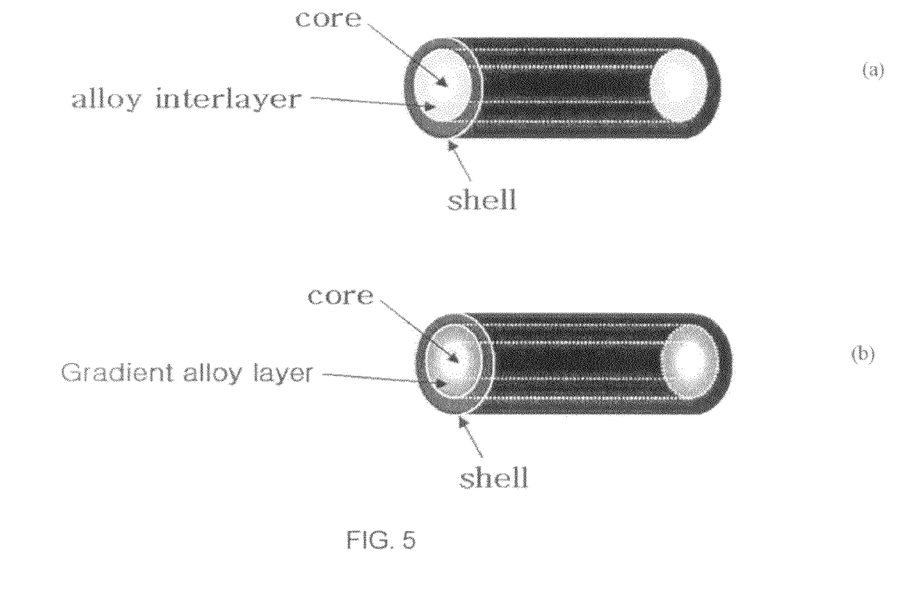
FIG. 5 is a schematic view showing a structure of tube type nanocrystals and of a gradient alloy layer, according to embodiments of the present invention.

FIG. 5 shows a structure of tube type interfused nanocrystals, according to embodiments of the present invention. In the three-dimensional shapes of tubes, a core, an alloy interlayer, and a shell may be sequentially formed. See, for example, FIG. 5(a). In addition, the alloy interlayer may be in the form of a gradient alloy layer, instead of a homogenous alloy phase. See, for example, FIG. 5(b). When two or more materials are connected in a thickness direction to grow them, in the cases where the core rod has a small diameter or the shell (or sheath) is thin, or either the shell or the core has a more rapid diffusion rate, an alloy core rod-shell structure or a core rod-alloy shell structure may be formed by the diffusion of the alloy layer.

Specifically, as shown in FIG. 1(a), the interfused nanocrystals may include a core, an alloy interlayer, and a shell, each of which is sequentially formed. Because the shell material or core material is diffused into the adjacent core material or shell material, respectively, the actual size of a core for light emission decreases, and thus, an emission wavelength is shifted into the blue light range. Even if a core having a relatively large size is used, it emits light in the blue light range. The shift of the emission wavelength assumes that the chemical composition of the core for emission varies with diffusion of the shell material or core material into the adjacent core material or shell material, respectively.

In addition, in the case where the shell material has a wider band gap than the core, luminous efficiency in the blue light range is drastically increased, by virtue of quantum confinement effects and passivation by the shell.

The alloy layer, which is formed on the outer surface of the core, functions to decrease the difference in a lattice constant between the core and the shell and thereby increase the material stability.

Each of the materials constituting the nanocrystals of embodiments of the present invention is selected from the group consisting of Group II-VI semiconductor compounds, Group III-V semiconductor compounds, Group IV-VI semiconductor compounds, and mixtures thereof.

Specifically, materials constituting the nanocrystals may include, for example, CdS, CdSe, CdTe, ZnS, ZnSe, ZnTe, HgS, HgSe, HgTe, PbS, PbSe, PbTe, AlN, AlP, AlAs, GaN, GaP, GaAs, InN, InP, InAs, or mixtures thereof.

The shape of each of the interfused nanocrystals according to embodiments of the present invention may be selected from the group consisting of spheres, tetrahedra, cylinders, rods, triangles, discs, tripods, tetrapods, cubes, boxes, stars, and tubes, but is not limited thereto.

Below, the interfused nanocrystals according to embodiments of the present invention are represented by "CdSe//ZnS", which means a CdSe nanocrystal and a ZnS nanocrystal having an alloy interlayer therebetween.

In addition, another aspect of embodiments of the present invention pertains to a method of preparing the interfused nanocrystals.

That is, a method of preparing the interfused nanocrystals of embodiments of the present invention includes (a) forming a first nanocrystal, (b) growing a second nanocrystal comprising a material different from that of the first nanocrystal on the surface of the first nanocrystal obtained in (a), and (c) forming an alloy layer at an interface between the first nanocrystal and the second nanocrystal through diffusion.

Specifically, in a preparation method of embodiments of the present invention, the formation of the first nanocrystal in (a) may be conducted by adding a metal precursor and a precursor of a Group V or VI compound to a solvent and a dispersant, and then mixing together to react. Likewise, the formation of the second nanocrystal in (b) may be conducted by adding metal precursor and a precursor of a Group V or VI compound to a solvent and a dispersant, and then mixing together to react and grow on the first nanocrystal.

That is, the metal precursor and the precursor of a Group V or VI compound may be added to the solvent and the dispersant, and mixed together to react, to prepare a predetermined first nanocrystal. Subsequently, the first nanocrystal thus prepared may be added to a solution, containing precursors for a second nanocrystal in the solvent and the dispersant, and mixed together to react. Thereby, the second nanocrystal may be grown on the surface of the first nanocrystal, and the alloy interlayer may be formed at the interface between the first nanocrystal and the second nanocrystal through diffusion.

The alloy interlayer may be formed at the interface between the first nanocrystal and the second nanocrystal, through diffusion of the second nanocrystal material into the first nanocrystal material, or of the first nanocrystal material into the second nanocrystal material. Therefore, as one nanocrystal material diffuses into the other nanocrystal material, the amount of the one nanocrystal material is reduced, thus obtaining nanocrystals having a new structure comprising an alloy interlayer formed at an interface between the first nanocrystal and the second nanocrystal. Such an alloy layer may decrease the difference in a lattice constant of the materials constituting the nanocrystals, therefore increasing the material stability. In addition, when the amount of the one nanocrystal material is reduced and then disappears, a first nanocrystal-alloy layer structure or an alloy layer-second nanocrystal structure may be formed.

In a preparation method of embodiments of the present invention, (b) and (c) are repeatedly conducted once or more. In the core-shell structure, when the interfused nanocrystals obtained through (b) and (c) are subjected again to (b), the crystal growth reaction occurs on the surface of the second nanocrystal material to form another layer. In this regard, the rod structure may be formed into tripods or tetrapods.

In a method of preparing the interfused nanocrystals of embodiments of the present invention, the metal precursor used in (a) and (b) may include, for example, dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bisacetylacetonate, tin bromide, tin chloride, tin fluoride, tin oxide, tin sulfate, germanium tetrachloride, germanium oxide, germanium ethoxide, gallium acetylacetonate, gallium chloride, gallium fluoride, gallium oxide, gallium nitrate, gallium sulfate, indium chloride, indium oxide, indium nitrate, or indium sulfate, but is not limited thereto.

In addition, in a method of preparing the interfused nanocrystals of embodiments of the present invention, the Group V or VI compound used in (a) and (b) may include, for example, alkyl thiol compounds, such as hexanethiol, octanethiol, decanethiol, dodecanethiol, hexadecanethiol or mercaptopropylsilane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, selenium-trioctylphosphine (Se-TOP), selenium-tributylphosphine (Se-TBP), selenium-triphenylphosphine (Se-TPP), tellurium-trioctylphosphine (Te-TOP), tellurium-tributylphosphine (Te-TBP), tellurium-triphenylphosphine (Te-TPP), trimethylsilyl phosphine, alkyl phosphines, such as triethyl phosphine, tributyl phosphine, trioctyl phosphine, triphenyl phosphine or tricyclohexyl phosphine, arsenic oxide, arsenic chloride, arsenic sulfate, arsenic bromide, arsenic iodide, nitric oxide, nitric acid, ammonium nitrate, etc.

As such, it is preferable that the concentration and rate of addition of the precursor be appropriately controlled depending on the reactivity of the precursor, so that undesired side-reactions, such as the separation of metal in the form of particles or the formation of additional particles by the reaction between the metal and the precursor of the Group V or VI compound, do not occur.

In addition, in a method of preparing the interfused nanocrystals of embodiments of the present invention, the solvent used in (a) and (b) may include, for example, primary alkyl amines having 6 to 22 carbons, secondary alkyl amines having 6 to 22 carbons, and tertiary alkyl amines having 6 to 22 carbons; primary alcohols having 6 to 22 carbons, secondary alcohols having 6 to 22 carbons, and tertiary alcohols having 6 to 22 carbons; ketones and esters, either of which have 6 to 22 carbons; a heterocyclic compound including nitrogen or sulfur, which has 6 to 22 carbons; alkanes having 6 to 22 carbons, alkenes having 6 to 22 carbons, and alkynes having 6 to 22 carbons; trioctylphosphine; and trioctylphosphine oxide.

In addition, in a method of preparing the interfused nanocrystals of embodiments of the present invention, the dispersant used in (a) and (b) may include, for example, alkanes or alkenes having 6 to 22 carbons and a COOH group at a terminal end thereof; alkanes or alkenes having 6 to 22 carbons and a POOH group at a terminal end thereof; alkanes or alkenes having 6 to 22 carbons and an SOOH group at a terminal end thereof; or alkanes or alkenes having 6 to 22 carbons and an $NH_2$ group at a terminal end thereof.

Specifically, the dispersant is exemplified by, but not limited to, oleic acid, stearic acid, palmitic acid, hexyl phosphonic acid, n-octyl phosphonic acid, tetradecyl phosphonic acid, octadecyl phosphonic acid, n-octyl amine, and hexadecyl amine.

In addition, in a method of preparing the interfused nanocrystals of embodiments of the present invention, (a) and (b) may each be conducted at 100° C. to 460° C., preferably 120° C. to 390° C., and more preferably 150° C. to 360° C., to assure the stability of the solvent while easily growing the crystals.

In addition, in a method of preparing the interfused nanocrystals of embodiments of the present invention, (a) and (b) may each be conducted for a time period from 5 sec to 4 hr, preferably from 10 sec to 3 hr, and more preferably, from 20 sec to 2 hr, to easily control the reaction rate.

In addition, in a method of preparing the interfused nanocrystals of embodiments of the present invention, the diffusion rate in (c) may be controlled by varying the reaction temperature, the reaction time, and the concentration of the metal precursor of the second nanocrystal in (b). Thus, even if a first nanocrystal having a consistent size is used, a material having a different emission wavelength may be obtained. By the same principle, even if a first nanocrystal having a varying size is used, the diffusion rate is controlled, therefore obtaining a material emitting light at a same wavelength.

Further, the diffusion rate in (c) may be controlled by stepwisely varying the reaction temperature in (b). Hence, even if a first nanocrystal having a consistent size is used, a material having a different emission wavelength may be obtained.

In addition, in a method of preparing the interfused nanocrystals of embodiments of the present invention, the metal precursor used in (b) may have a concentration of 0.001 M to 2 M, and preferably 0.1 M to 1.6 M, to increase the luminous efficiency in the blue light wavelength range.

In addition, in a method of preparing the interfused nanocrystals of embodiments of the present invention, the molar ratio of a metal precursor to a precursor of a Group V or VI compound used in (b) may range from 100:1 to 1:50, and preferably from 50:1 to 1:10, to increase the luminous efficiency in the blue light wavelength range.

A further aspect of embodiments of the present invention pertains to interfused nanocrystals prepared using the above method. The shape of each of the nanocrystals may be selected from the group consisting of spheres, tetrahedra, cylinders, rods, triangles, discs, tripods, tetrapods, cubes, boxes, stars, and tubes, but is not limited thereto.

The above nanocrystals may have an emission range from 350 nm to 700 nm, and preferably, from 380 nm to 490 nm and emit light with a maximum emission peak in the above range. The quantum efficiency of the nanocrystals is in the range of 0.1% to 100%, and preferably, 20% to 100%.

Interfused nanocrystals of embodiments of the present invention may be variously applied to displays, sensors, energy fields, etc., and, in particular, are useful in the formation of the light-emitting layer of a light-emitting diode for emitting blue light.

Yet another aspect of embodiments of the present invention pertains to a diode including the interfused nanocrystals. Specifically, an organic-inorganic electrical light-emitting diode, in which the interfused nanocrystals are used as a light-emitting layer, may be provided.

Figure 12:
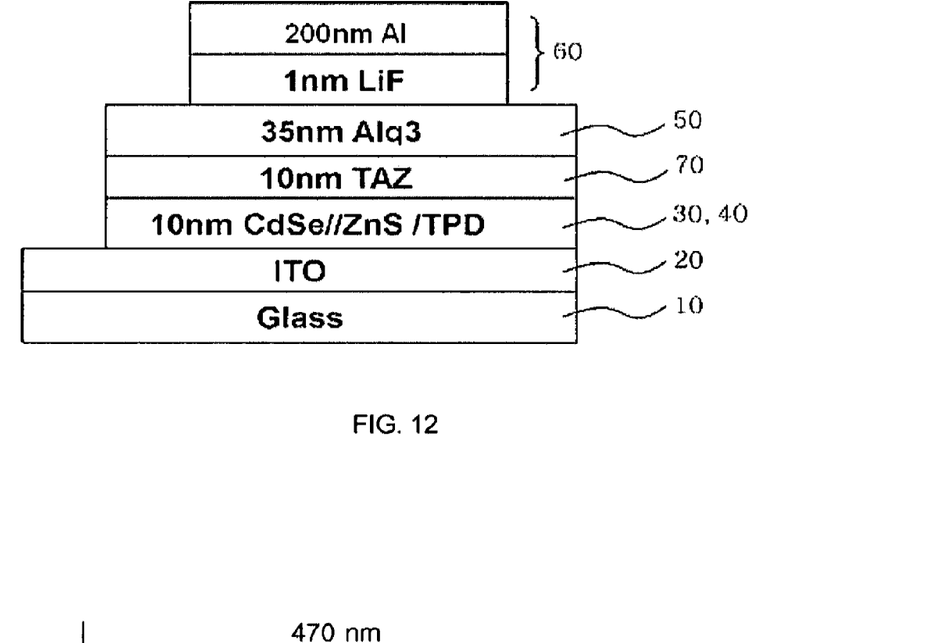
FIG. 12 is a schematic sectional view showing the structure of the organic-inorganic hybrid electrical light-emitting diode, manufactured in Example 8.

As is apparent from FIG. 12, an organic-inorganic electrical light-emitting diode of embodiments of the present invention may comprise a substrate 10, a hole-injecting electrode 20, a hole-transporting layer 30, a light-emitting layer 40, an electron-transporting layer 50, and an electron-injecting layer 60, each of which is sequentially formed. The light-emitting layer 40 may include interfused semiconductor nanocrystals of embodiments of the present invention.

Hole-transporting layer 30 and light-emitting layer 40 may be formed as a single layer. Also, electron-injecting layer 60 may be formed of two or more layers.

Further, in embodiments of the present invention, a hole-inhibiting layer 70 may be selectively formed between the light-emitting layer 40 and the electron-transporting layer 50.

Specifically, the substrate 10 used in the electrical light-emitting diode of embodiments of the present invention may include commonly used substrates, for example, a glass substrate or a transparent plastic substrate, having excellent transparency, surface evenness, ease of handling and waterproofness. More particularly, it is exemplified by a glass substrate, a polyethyleneterephthalate substrate, or a polycarbonate substrate.

In addition, a material for the hole-injecting electrode 20 may include conductive metals or oxides thereof, for example, ITO (Indium Tin Oxide), IZO (Indium Zinc Oxide), nickel (Ni), platinum (Pt), gold (Au), silver (Ag), iridium (Ir).

In addition, a material for the hole-transporting layer 30 may include all commonly used materials, for example, poly (3,4-ethylenediophene) (PEDOT)/polystyrene p-sulfonate (PSS), poly-N-vinylcarbazole derivatives, polyphenylenevinylene derivatives, polyparaphenylene derivatives, polymethacrylate derivatives, poly(9,9-octylfluorene) derivatives, poly(spiro-fluorene) derivatives, or TPD (N,N'-bis-(3-methylphenyl)-N,N'-bis-(phenyl)-benzidine), but is not limited thereto. The hole-transporting layer 30 of embodiments of the present invention is preferably 10 to 100 nm thick.

In addition, a material for the electron-transporting layer 50 may include commonly used materials, for example, an oxazole compound, an iso-oxazole compound, a triazole compound, an iso-thiazole compound, an oxydiazole compound, a thiadiazole compound, a perylene compound, an aluminum complex, such as tris(8-hydroxyquinoline)-aluminum (Alq3), bis(2-methyl-8-quinolato)(p-phenyl-phenolato) aluminum (Balq), bis(2-methyl-8-quinolinato)(triphenylsiloxy)aluminum(III) (Salq), but is not limited thereto. In embodiments of the present invention, the electron-transporting layer 50 is preferably 10 to 100 nm thick.

In addition, a material for the electron-injecting electrode 60 may include metals having a low work function to easily inject an electron, for example, I, Ca, Ba, Ca/Al, LiF/Ca, LiF/Al, BaF2/Al, BaF2/Ca/Al, Al, Mg, Ag:Mg alloy, but is not limited thereto. In embodiments of the present invention, the electron-injecting electrode 60 is preferably 50 to 300 nm thick.

Further, a material for the hole-inhibiting layer 70 may include materials commonly used in the art, for example, 3-(4-biphenyl)-4-phenyl-5-(4-tert-butylphenyl)-1,2,4-triazole (TAZ), 2,9-dimethyl-1,10-phenanthroline (BCP), a phenanthroline compound, an imidazole compound, a triazole compound, an oxadiazole compound, an aluminum complex, but is not limited thereto. In embodiments of the present invention, the hole-inhibiting layer 70 is preferably 5 to 50 nm thick.

A better understanding of embodiments of the present invention may be obtained in light of the following examples, which are set forth to illustrate, but are not to be construed to limit the present invention.

Example 1

Synthesis of CdSe Nanocrystal and Interfused CdSe//ZnS 16 g of trioctylamine (TOA), 0.3 g of octadecyl phosphonic acid, and 0.4 mmol cadmium oxide were simultaneously loaded into a 125 ml flask equipped with a reflux condenser, and then the temperature of the reaction mixture was maintained at 300° C. with stirring. Separately, a 2 M Se-TOP solution was prepared by dissolving Se powder in trioctylphosphine (TOP). 2 ml of the 2 M Se-TOP solution was rapidly added to the above stirred reaction mixture, and reacted for about 2 min. After completion of the reaction, the reaction mixture was cooled down to room temperature rapidly, and ethanol was added as a non-solvent. After centrifuging the obtained reaction solution, the supernatant of the solution was decanted, with the exception of the centrifuged precipitate, and the precipitate was dispersed in toluene, to prepare a CdSe nanocrystal solution.

8 g of TOA, 0.1 g of oleic acid, and 0.4 mmol zinc acetate were simultaneously loaded into a 125 ml flask equipped with a reflux condenser, and the reaction temperature was maintained at 300° C. with stirring. Subsequently, the above-synthesized CdSe nanocrystal solution was added to the reaction mixture, and an S-TOP solution was slowly added. The reaction was performed for about 1 hr. After completion of the reaction, the reaction mixture was cooled down to room temperature rapidly, and ethanol was added as a non-solvent. After centrifuging the obtained reaction solution, the supernatant of the solution was decanted, with the exception of the centrifuged precipitate, and the precipitate was dispersed in toluene, to prepare CdSe//ZnS as interfused nanocrystals having a size of 5 nm.

Figure 6:
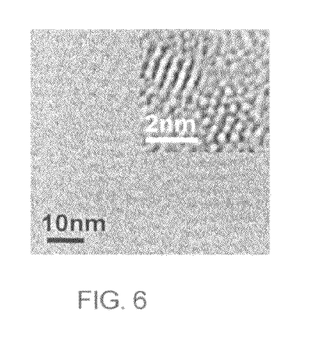
FIG. 6 is a transmission electron micrograph of a CdSe core nanocrystal, obtained in Example 1.
Figure 7:
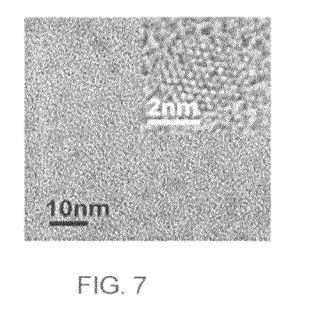
FIG. 7 is a transmission electron micrograph of CdSe//ZnS nanocrystals, obtained in Example 1.
Figure 8:
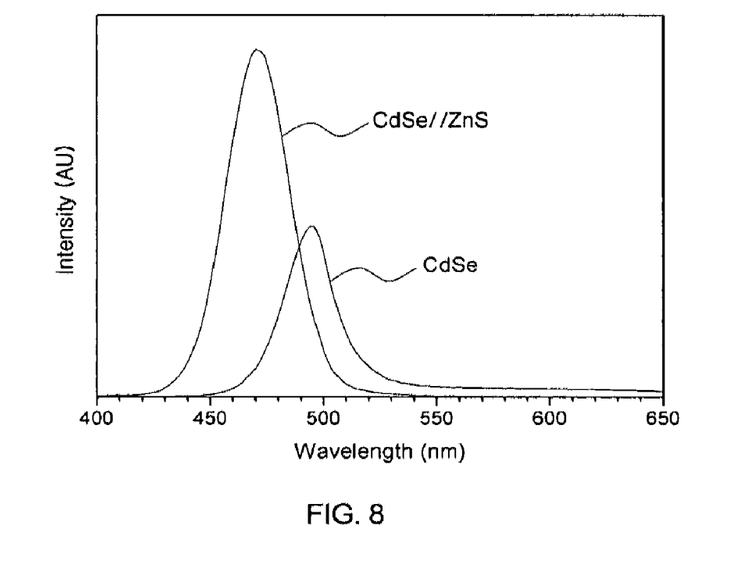
FIG. 8 is photoluminescence spectra of CdSe//ZnS nanocrystals and the CdSe core nanocrystal, obtained in Example 1.

The nanocrystals thus obtained emitted blue light under a 365 nm UV lamp. The transmission electron micrograph of the interfused CdSe core and the CdSe//ZnS nanocrystals is shown in FIG. 6 and FIG. 7, respectively. A photoluminescence spectra, showing the excited light emission spectrum of the CdSe and the CdSe//ZnS nanocrystals, is shown in FIG. 8. As shown in FIG. 3, maximum emission peaks of the interfused CdSe//ZnS nanocrystals and the CdSe core appeared at 470 nm and 496 nm, respectively.

Example 2

Effect of Reaction Temperature on Synthesis of Interfused CdSe//ZnS 8 g of TOA, 0.1 g of oleic acid, and 0.4 mmol zinc acetate were simultaneously loaded into a 125 ml flask equipped with a reflux condenser, and the temperature of the reaction mixture was maintained at each of 220, 260, 300 and 320° C. with stirring. Subsequently, the CdSe nanocrystal solution synthesized in Example 1 was added to the reaction mixture, and an S-TOP solution was slowly added thereto. The reaction was performed for about 1 hr. After completion of the reaction, the reaction mixture was cooled down to room temperature rapidly, and ethanol was added as a non-solvent. After centrifuging the obtained reaction solution, the supernatant of the solution was decanted, with the exception of the centrifuged precipitate, and the precipitate was dispersed in toluene, to prepare CdSe//ZnS as interfused nanocrystals having a size of 5 nm.

The CdSe core had a maximum emission peak of 522 nm, and the interfused CdSe//ZnS nanocrystals emitted blue light at a wavelength that varied with the reaction temperature. The variation in emission peaks depending on the reaction temperature is summarized in Table 1, below.

TABLE 1

Emission Wavelength of CdSe//Zns Synthesized at Different Reaction Temperatures using CdSe Core Emitting Light at 522 nm

| Reaction Temperature (° C.) | Emission Wavelength (nm) |
|---|---|
| 220 | 498 |
| 260 | 476 |
| 300 | 440 |
| 320 | 442 |

Example 3

Effect of Reaction Time on Synthesis of Interfused CdSe//ZnS 8 g of TOA, 0.1 g of oleic acid, and 0.4 mmol zinc acetate were simultaneously loaded into a 125 ml flask equipped with a reflux condenser, and the temperature of the reaction mixture was maintained at 300° C. with stirring. Subsequently, the CdSe nanocrystal solution synthesized in Example 1 was added to the reaction mixture, and an S-TOP solution was slowly added thereto. The reaction was performed for each of 5 min, 20 min, 40 min, and 1 hr. After completion of the reaction, the reaction mixture was cooled down to room temperature rapidly, and ethanol was added as a non-solvent. After centrifuging the obtained reaction solution, the supernatant of the solution was decanted, with the exception of the centrifuged precipitate, and the precipitate was dispersed in toluene, to prepare CdSe//ZnS as interfused nanocrystals having a size of 5 nm.

The nanocrystals thus obtained emitted blue light under a 365 nm UV lamp. The CdSe core had a maximum emission peak of 496 nm, and the interfused CdSe//ZnS nanocrystals emitted blue light at a wavelength that varied with the reaction time. The variation in emission peaks depending on the reaction time is summarized in Table 2, below.

TABLE 2

Emission Wavelength of CdSe//ZnS Synthesized for Different Reaction Times using CdSe Core Emitting Light at 496 nm

| Reaction Time (min) | Emission Wavelength (nm) |
|---|---|
| 0 | 496 |
| 5 | 484 |
| 20 | 476 |
| 40 | 464 |
| 60 | 440 |

Example 4

Effect of Concentration of Precursor on Synthesis of CdSe//ZnS

Into a 125 ml flask equipped with a reflux condenser, 8 g of TOA was loaded while oleic acid was added in varying amounts of 0.01, 0.05, and 0.1 g and zinc acetate in varying concentrations of 0.04, 0.2 and 0.4 mmol. The temperature of the reaction mixture was maintained at 300° C. with stirring. Subsequently, the CdSe nanocrystal solution synthesized in Example 1 was added to the reaction mixture, and an S-TOP solution was slowly added thereto. The reaction was performed for about 30 min. After completion of the reaction, the reaction mixture was cooled down to room temperature rapidly, and ethanol was added as a non-solvent. After centrifuging the obtained reaction solution, the supernatant of the solution was decanted, with the exception of the centrifuged precipitate, and the precipitate was dispersed in toluene, to prepare CdSe//ZnS as interfused nanocrystals having a size of 5 nm.

The CdSe core had a maximum emission peak of 496 nm, and the interfused CdSe//ZnS nanocrystals emitted blue light at a wavelength that varied with the concentration of the precursor. The variation in emission peaks depending on the concentration of the precursor is summarized in Table 3, below.

TABLE 3

Emission Wavelength of CdSe//Zns Synthesized at Different Precursor Concentrations for 30 min using CdSe Core Emitting Light at 496 nm

| Concentration of Zn Precursor in Synthesized Solution (mM) | Emission Wavelength (nm) |
|---|---|
| 4 | 474 |
| 20 | 468 |
| 40 | 459 |

Example 5

Synthesis of Interfused CdSe//ZnS With Controlled Reaction Temperature 16 g of TOA, 0.3 g of octadecyl phosphonic acid, and 0.4 mmol cadmium oxide were simultaneously loaded into a 125 ml flask equipped with a reflux condenser, and then the temperature of the reaction mixture was maintained at 300° C. with stirring. Separately, a 2 M Se-TOP solution was prepared by dissolving Se powder in trioctylphosphine (TOP). 2 ml of the 2 M Se-TOP complex solution was rapidly added to the above stirred reaction mixture, and the reaction was performed for about 2 min. After completion of the reaction, the reaction mixture was cooled down to room temperature rapidly, and ethanol was added as a non-solvent. After centrifuging the obtained reaction solution, the supernatant of the solution was decanted, with the exception of the centrifuged precipitate, and the precipitate was dispersed in toluene, to prepare a CdSe nanocrystal solution.

8 g of TOA, 0.1 g of oleic acid, and 0.4 mmol zinc acetate were simultaneously loaded into a 125 ml flask equipped with a reflux condenser, and the temperature of the reaction mixture was maintained at 260° C. with stirring. Subsequently, the above-synthesized CdSe nanocrystal solution was added to the reaction mixture, and an S-TOP solution was slowly added thereto. The reaction was performed for about 1 hr. Thereafter, the reaction temperature was slowly increased to 300° C., at which the reaction performed for about 1 hr. After completion of the reaction, the reaction mixture was cooled down to room temperature rapidly, and ethanol was added as a non-solvent. After centrifuging the obtained reaction solution, the supernatant of the solution was decanted, with the exception of the centrifuged precipitate, and the precipitate was dispersed in toluene, to prepare CdSe//ZnS as interfused nanocrystals having a size of 5 nm.

Figure 9:
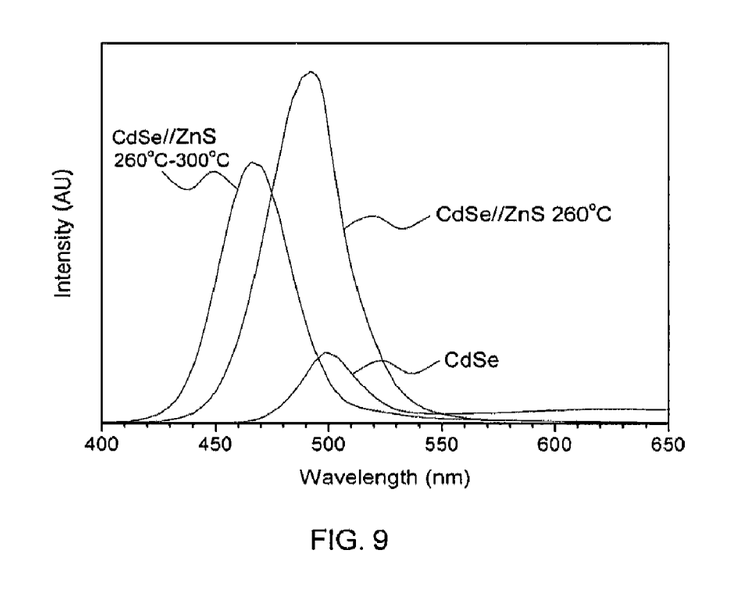
FIG. 9 is photoluminescence spectra of CdSe//ZnS nanocrystals and a CdSe core nanocrystal, obtained in Example 5.

A photoluminescence spectra, showing the excited light emission spectrum of the CdSe solution used as a core, the nanocrystal solution obtained through the reaction at 260° C. for 1 hr, and the nanocrystal solution obtained through the reaction at 260° C. for 1 hr and then 300° C. for 1 hr, is shown in FIG. 9. As shown in FIG. 9, maximum emission peaks appeared at 498, 492 and 466 nm, respectively.

Example 6

Synthesis of Interfused CdSe//ZnSe 8 g of TOA, 0.1 g of oleic acid, and 0.4 mmol zinc acetate were simultaneously loaded into a 0.125 ml flask equipped with a reflux condenser, and the temperature of the reaction mixture was maintained at 300° C. with stirring. Subsequently, the CdSe nanocrystal solution synthesized in Example 1 was added to the reaction mixture, and a Se-TOP complex solution was slowly added thereto. The reaction occurred for about 1 hr. After completion of the reaction, the reaction mixture was cooled down to room temperature rapidly, and ethanol was added as a non-solvent. After centrifuging the obtained reaction solution, the supernatant of the solution was decanted, with the exception of the centrifuged precipitate, and the precipitate was dispersed in toluene, to prepare CdSe//ZnSe as interfused nanocrystals having a size of 5 nm.

Figure 10:
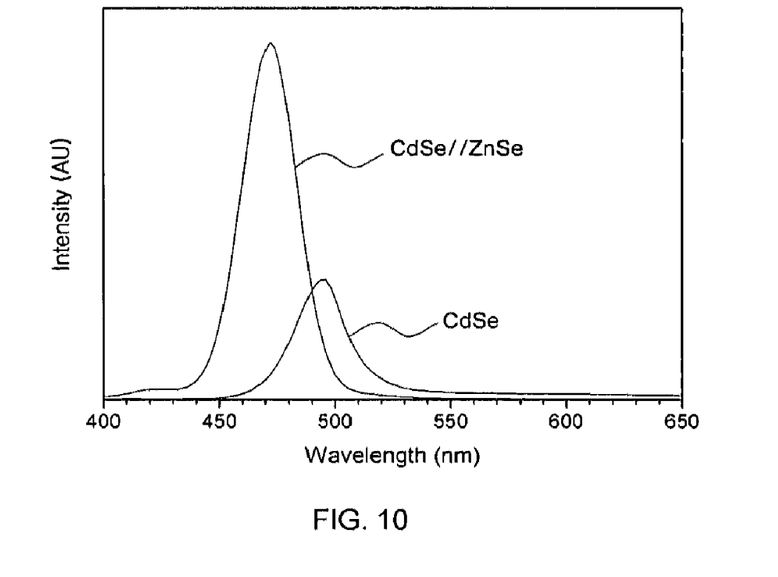
FIG. 10 is photoluminescence spectra of CdSe//ZnSe nanocrystals and the CdSe core nanocrystal, obtained in Example 6.

The nanocrystals thus obtained emitted blue light under a 365 nm UV lamp. A photoluminescence spectra, showing the excited light emission spectrum of the above nanocrystal solution and the CdSe core, is shown in FIG. 10. As shown in FIG. 10, maximum emission peaks appeared at 472 nm and 496 nm, respectively.

Example 7

Synthesis of CdSeS Nanocrystal and Interfused CdSeS//ZnS 16 g of TOA, 0.5 g of oleic acid, and 0.4 mmol cadmium oxide were simultaneously loaded into a 125 ml flask equipped with a reflux condenser, and then the reaction temperature was maintained at 300° C. while the reaction mixture was stirred. Separately, a 0.25 M Se-TOP solution was prepared by dissolving Se powder in trioctylphosphine (TOP), and a 1.0 M S-TOP solution was prepared by dissolving S powder in trioctylphosphine (TOP). A mixture of 0.9 ml of the S-TOP solution and 0.1 ml of the Se-TOP solution were rapidly added to the above stirred reaction mixture, and further reacted for 4 min. After completion of the reaction, the reaction mixture was cooled down to room temperature rapidly, and ethanol was added as a non-solvent. After centrifuging the obtained reaction solution, the supernatant of the solution was decanted, with the exception of the centrifuged precipitate, and the precipitate was dispersed in toluene to obtain a 1 wt % solution, to prepare a CdSeS nanocrystal solution.

8 g of TOA, 0.1 g of oleic acid, and 0.4 mmol zinc acetate were simultaneously loaded into a 125 ml flask equipped with a reflux condenser, and the temperature of the reaction mixture was maintained at 300° C. with stirring. Subsequently, the above synthesized CdSeS nanocrystal solution was added to the reaction mixture, and the S-TOP solution was slowly added thereto. The reaction was performed for about 1 hr. After completion of the reaction, the reaction mixture was cooled down to room temperature rapidly, and ethanol was added as a non-solvent. After centrifuging the obtained reaction solution, the supernatant of the solution was decanted, with the exception of the centrifuged precipitate, and the precipitate was dispersed in toluene, to prepare CdSeS//ZnS as interfused nanocrystals having a size of 5 nm.

Figure 11:
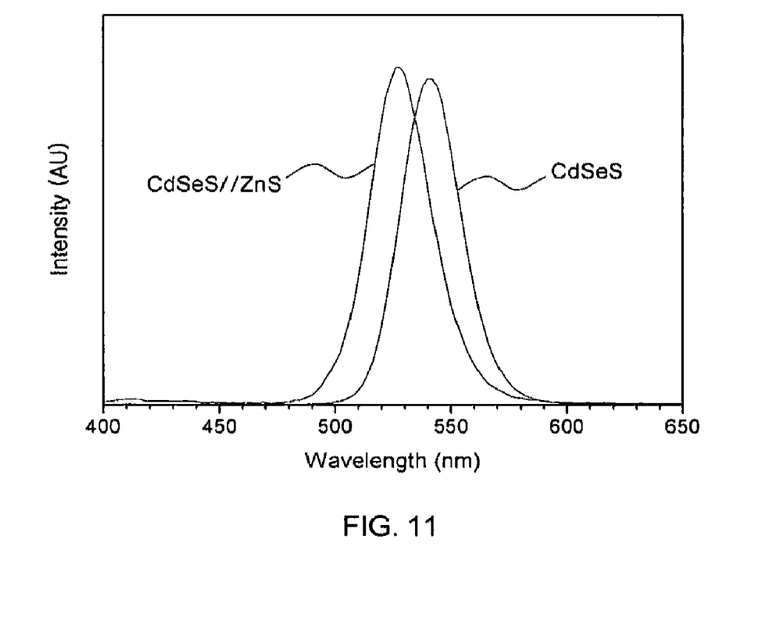
FIG. 11 is photoluminescence spectra of CdSeS//ZnS nanocrystals and a CdSeS core nanocrystal, obtained in Example 7.

The nanocrystals thus obtained emitted blue light under a 365 nm UV lamp. A photoluminescence spectrum, showing the excited light emission spectrum of the above nanocrystal solution and the CdSeS core, is shown in FIG. 11. As is apparent from FIG. 11, maximum emission peaks appeared at 527 nm and 540 nm, respectively.

Example 8

Manufacture of Organic-Inorganic Hybrid Electrical Light Emitting Diode Using CdSe//ZnS Nanocrystals Emitting Blue Light as Light Emitting Layer The present example is a preparative example of manufacturing an organic-inorganic hybrid electrical light emitting diode using the CdSe//ZnS nanocrystals prepared in Example 1 as a light emitting material of the electrical light emitting diode.

A chloroform solution of 3 wt % N,N'-bis-(3-methylphenyl)-N,N'-bis-(phenyl)-benzidine (TPD) serving as a hole transporting material and a chloroform solution of 1 wt % CdSe//ZnS prepared in Example 1 were mixed and spin-coated on a patterned ITO layer, and then dried, to form a single hole transporting and light emitting layer.

On the completely dried hole transporting and light emitting layer formed of nanocrystals, 3-(4-biphenylyl)-4-phenyl-5-(4-tert-butylphenyl)-1,2,4-triazole (TAZ) was deposited to a thickness of 10 nm, to form a hole inhibiting layer, on which tris-(8-hydroxyquinoline)aluminum ($Alq_3$) serving as an electron transporting layer was deposited to a thickness of 30 nm. Subsequently, LiF was deposited to a thickness of 1 nm on the electron transporting layer, after which aluminum was deposited to a thickness of 200 nm to form a cathode, thereby completing an electrical light emitting diode.

Figure 13:
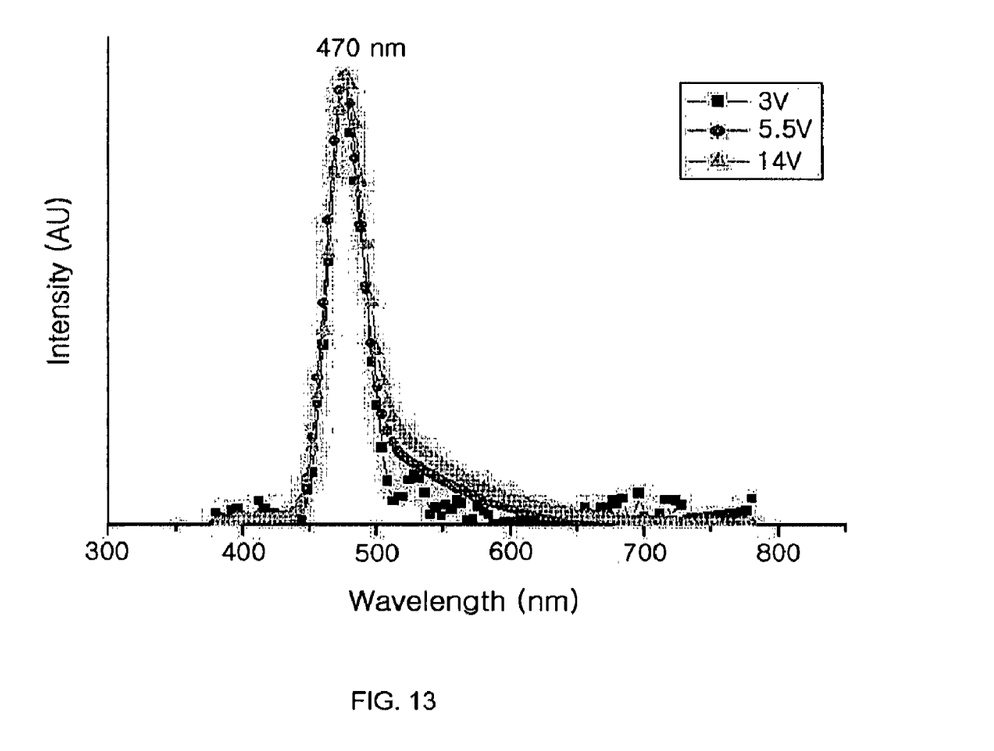
FIG. 13 is electroluminescence spectra of the nanocrystals used in the organic-inorganic hybrid electrical light-emitting diode, manufactured in Example 8.

The structure of the organic-inorganic hybrid electrical light emitting diode thus manufactured is shown in FIG. 12, and the electrical light emitting spectrum thereof is shown in FIG. 13. As is apparent from FIG. 13, the emission peak was about 470 nm, FWHM was about 36 nm, and brightness was 500 Cd/m², and the efficiency of the device was 1.5 Cd/A.

As described hereinbefore, embodiments of the present invention provide interfused nanocrystals and a method of preparing the interfused nanocrystals. Interfused nanocrystals of embodiments of the present invention have an alloy layer between different crystals, thus increasing the material stability. Further, material having very excellent light emitting efficiency in the blue light range may be prepared.

Although the preferred embodiments of embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of preparing interfused nanocrystals, comprising: (a) forming a first nanocrystal; (b) growing a second nanocrystal comprising a material different from that of the first nanocrystal on a surface of the first nanocrystal formed in (a); and (c) forming an alloy layer at an interface between the first nanocrystal and the second nanocrystal through diffusion; wherein each of (b) and (c) is conducted at 120° C. to 390° C. for a time period of 1 minute to 2 hours; and wherein an emission wavelength of the interfused nanocrystal is shifted into a blue light range; wherein the first and second nanocrystals are selected from the group consisting of Group II-VI semiconductor compounds, Group III-V semiconductor compounds, Group IV-VI semiconductor compounds, and mixtures thereof; and wherein the semiconductor compounds are selected from the group consisting of CdS, CdSe, CdTe, ZnS, ZnSe, ZnTe, HgS, HgSe, HgTe, PbS, PbSe, PbTe, AlN, AlP, AlAs, GaN, GaP, GaAs, InN, InP, InAs, or mixtures thereof; the nanocrystal so formed having a total particle size of up to about 5 nm; wherein a metal precursor used in (b) has a concentration of 0.001 M to 2 M.

2. The method as set forth in claim 1, wherein (b) and (c) are conducted multiple times.

3. The method as set forth in claim 1, wherein the forming of the first nanocrystal in (a) is conducted by adding a metal precursor and a precursor of a Group V or VI compound to a solvent and a dispersant, and then mixing together to react, and, wherein the forming of the second nanocrystal in (b) is conducted by adding a metal precursor and a precursor of a Group V or VI compound to a solvent and a dispersant, and then mixing together to react.

4. The method as set forth in claim 1, wherein the first nanocrystals are formed by adding a metal precursor and a precursor of a Group V or VI compound to a first solvent and a first dispersant, and then mixing together to react, and wherein growing a second nanocrystal on a surface of the first nanocrystal comprises adding the first nanocrystal thus prepared to a solution containing precursors for a second nanocrystal in a second solvent and a second dispersant, and then mixing together to react.

5. The method as set forth in claim 1, wherein the alloy layer is an alloy interlayer comprising an alloy of the first nanocrystal and the second nanocrystal and being formed at the interface between the first nanocrystal and the second nanocrystal.

6. The method as set forth in claim 1, wherein the alloy layer is a gradient alloy layer comprising an alloy of the first nanocrystal and the second nanocrystal.

7. The method as set forth in claim 1, wherein the alloy layer is an alloy layer formed from diffusion of the second nanocrystal material into the first nanocrystal material.

8. The method as set forth in claim 7, wherein the first nanocrystal material is subsumed into the alloy layer.

9. The method as set forth in claim 1, wherein the alloy layer is an alloy layer formed from diffusion of the first nanocrystal material into the second nanocrystal material.

10. The method as set forth in claim 9, wherein the second nanocrystal material is subsumed into the alloy layer.

11. The method as set forth in claim 3, wherein the metal precursor is selected from the group consisting of dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bisacetylacetonate, tin bromide, tin chloride, tin fluoride, tin oxide, tin sulfate, germanium tetrachloride, germanium oxide, germanium ethoxide, gallium acetylacetonate, gallium chloride, gallium fluoride, gallium oxide, gallium nitrate, gallium sulfate, indium chloride, indium oxide, indium nitrate, and indium sulfate.

12. The method as set forth in claim 3, wherein the Group V or VI compound is selected from the group consisting of alkyl thiol compounds, including hexanethiol, octanethiol, decanethiol, dodecanethiol, hexadecanethiol or mercaptopropylsilane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, selenium-trioctylphosphine (Se-TOP), selenium-tributylphosphine (Se-TBP), selenium-triphenylphosphine (Se-TPP), tellurium-trioctylphosphine (Te-TOP), tellurium-tributylphosphine (Te-TBP), tellurium-triphenylphosphine (Te-TPP), trimethylsilyl phosphine, alkyl phosphines, including triethyl phosphine, tributyl phosphine, trioctyl phosphine, triphenyl phosphine or tricyclohexyl phosphine, arsenic oxide, arsenic chloride, arsenic sulfate, arsenic bromide, arsenic iodide, nitric oxide, nitric acid, and ammonium nitrate.

13. The method as set forth in claim 3, wherein the solvent is selected from the group consisting of primary alkyl amines, secondary alkyl amines, and tertiary alkyl amines, each of which has 6 to 22 carbons; primary alcohols, secondary alcohols, and tertiary alcohols, each of which has 6 to 22 carbons; ketones and esters, either of which have 6 to 22 carbons; a heterocyclic compound including nitrogen or sulfur, which has 6 to 22 carbons; alkanes, alkenes, and alkynes, each of which has 6 to 22 carbons; trioctylphosphine; and trioctylphosphine oxide.

14. The method as set forth in claim 3, wherein the dispersant is selected from the group consisting of alkanes or alkenes having 6 to 22 carbons and a carboxylic acid functional group at a terminal end thereof, alkanes or alkenes having 6 to 22 carbons and a phosphonic acid functional group at a terminal end thereof, alkanes or alkenes having 6 to 22 carbons and a sulfonic acid functional group at a terminal end thereof, and alkanes or alkenes having 6 to 22 carbons and an amine (—NH₂) group at a terminal end thereof.

15. The method as set forth in claim 3, wherein the dispersant is selected from the group consisting of oleic acid, stearic acid, palmitic acid, hexyl phosphonic acid, n-octyl phosphonic acid, tetradecyl phosphonic acid, octadecyl phosphonic acid, n-octyl amine, and hexadecyl amine.

16. The method as set forth in claim 1, wherein each of (a) and (b) is conducted for a time period from 5 sec to 4 hr.

17. The method as set forth in claim 1, wherein the reaction temperature of (b) increases or decreases stepwisely.

18. The method as set forth in claim 1, wherein a molar ratio of the metal precursor to the precursor of a Group V or VI compound used in (b) ranges from 100:1 to 1:50.

19. A diode, comprising interfused nano crystals, wherein the interfused nanocrystals are manufactured by a method comprising:
(a) forming a first nano crystal;
(b) growing a second nanocrystal comprising a material different from that of the first nanocrystal on a surface of the first nanocrystal formed in (a); and
(c) forming an alloy layer at an interface between the first nanocrystal and the second nanocrystal through diffusion; wherein each of (b) and (c) is conducted at 120° C. to 390° C. for a time period of 1 minute to 2 hours; and wherein an emission wavelength of the interfused nanocrystal is shifted into a blue light; wherein the first and second nanocrystals are selected from the group consisting of Group II-VI semiconductor compounds, Group III-V semiconductor compounds, Group IV-VI semiconductor compounds, and mixtures thereof and wherein the semiconductor compounds are selected from the group consisting of CdS, CdSe, CdTe, ZnS, ZnSe, ZnTe, HgS, HgSe, HgTe, PbS, PbSe, PbTe, AlN, AlP, AlAs, GaN, GaP, GaAs, InN, InP, InAs or mixtures thereof the nanocrystal so formed having a total particle size of up to about 5 nm; wherein a molar ratio of a metal precursor to a precursor of a Group V or VI compound used in (b) ranges from 100:1 to 1:50.

20. The diode as set forth in claim 19, wherein the diode is an organic-inorganic hybrid electrical light-emitting diode.

21. The diode as set forth in claim 19, wherein the organic-inorganic hybrid electrical light-emitting diode comprises: (i) a substrate; (ii) a hole-injecting electrode; (iii) a hole-transporting and light-emitting layer; (iv) an electron-transporting layer; and (v) an electron-injecting electrode, each of which is sequentially formed, and wherein the light-emitting layer includes the interfused semiconductor nanocrystals.

22. The diode as set forth in claim 19, wherein the organic-inorganic hybrid electrical light-emitting diode comprises: (i) a substrate; (ii) a hole-injecting electrode; (iii) a hole-transporting layer; (iv) a light-emitting layer; (v) an electron-transporting layer; and (vi) an electron-injecting electrode, each of which is sequentially formed, and wherein the light-emitting layer includes the interfused semiconductor nanocrystals.

23. The diode as set forth in claim 22, further comprising a hole-inhibiting layer between the light-emitting layer and the electron-transporting layer.

24. The diode as set forth in claim 22, wherein the substrate is selected from the group consisting of a glass substrate, a polyethyleneterephthalate substrate, and a polycarbonate substrate.

25. The diode as set forth in claim 22, wherein the hole-injecting electrode comprises a material selected from the group consisting of conductive metals and oxides thereof, including ITO (Indium Tin Oxide), IZO (Indium Zinc Oxide), nickel (Ni), platinum (Pt), gold (Au), silver (Ag), or iridium (Ir).

26. The diode as set forth in claim 22, wherein the hole-transporting layer comprises a material selected from the group consisting of poly(3,4-ethylenediophene) (PEDOT)/ polystyrene p-sulfonate (PSS), poly-N-vinylcarbazole derivatives, polyphenylenevinylene derivatives, polyparaphenylene derivatives, polymethacrylate derivatives, poly (9,9-octylfluorene)derivatives, poly(spiro-fluorene) derivatives, and TPD (N,N'-bis-(3-methylphenyl)-N,N'-bis-(phenyl)-benzidine).

27. The diode as set forth in claim 22, wherein the electron-transporting layer comprises a material selected from the group consisting of an oxazole compound, an iso-oxazole compound, a triazole compound, an iso-thiazole compound, an oxydiazole compound, a thiadiazole compound, a perylene compound, and an aluminum complex, including tris(8-hydroxyquinoline)-aluminum (Alq3), bis(2-methyl-8-quinolato)(p-phenyl-phenolato)aluminum (Balq) or bis(2-methyl-8-quinolinato)(triphenylsiloxy)aluminum(III) (Salq).

28. The diode as set forth in claim 22, wherein the electron-injecting electrode comprises a material selected from the group consisting of 1, Ca, Ba, Ca/Al, LiF/Ca, LiF/Al, BaF2/ Al, BaF2/Ca/Al, Al, Mg, and Ag:Mg alloy.

29. The diode as set forth in claim 23, wherein the hole-inhibiting layer comprises a material selected from the group consisting of 3-(4-biphenylyl)-4-phenyl-5-(4-tert-butylphenyl)-1,2,4-triazole (TAZ), 2,9-dimethyl-1,10-phenanthroline (BCP), a phenanthroline compound, an imidazole compound, a triazole compound, an oxadiazole compound, and an aluminum complex.

* * * * *